United States Patent [19]

Tsuchinaga et al.

[11] Patent Number: 5,448,544
[45] Date of Patent: Sep. 5, 1995

[54] DATA RECORDING/PLAYBACK APPARATUS AND SIGNAL PROCESSING METHOD

[75] Inventors: Hiroyuki Tsuchinaga; Takeshi Maeda; Kiyoshi Matsumoto, all of Kokubunji, Japan

[73] Assignee: Hitachi, Ltd., Tokyo, Japan

[21] Appl. No.: 26,817

[22] Filed: Mar. 5, 1993

[30] Foreign Application Priority Data

Mar. 19, 1992 [JP] Japan .................................. 4-063066

[51] Int. Cl.⁶ ............................ G11B 5/00; H04N 5/76
[52] U.S. Cl. ............................................. 369/59; 360/32
[58] Field of Search .................. 360/53, 51, 46, 32, 360/40; 369/59, 63, 53

[56] References Cited

U.S. PATENT DOCUMENTS

| | | | |
|---|---|---|---|
| 4,081,756 | 3/1978 | Price et al. | 360/53 X |
| 4,387,364 | 6/1983 | Shirota | 340/347 DD |
| 4,672,480 | 6/1987 | Yamamoto | 360/32 |
| 4,789,838 | 12/1988 | Cheng | 323/150 |
| 4,837,639 | 6/1989 | Matsumoto | 360/27 |
| 5,050,018 | 9/1991 | Georgis et al. | 360/32 X |
| 5,084,786 | 1/1992 | Konno et al. | 360/53 X |
| 5,121,263 | 6/1992 | Kerwin et al. | 360/53 |
| 5,146,370 | 9/1992 | Endo et al. | 360/32 X |
| 5,202,876 | 4/1993 | Takagi et al. | 360/53 X |
| 5,212,695 | 5/1993 | Shikakura et al. | 371/37.1 |
| 5,220,466 | 6/1993 | Coker et al. | 360/46 |

FOREIGN PATENT DOCUMENTS 2-81324  3/1990  Japan .

OTHER PUBLICATIONS

J. L. E. Baldwin, "Digital Television Recording with Low Tape Consumption", Documents of IBC, '78 Record, pp. 133–136 (1978).

M. Morizono et al, "Digital Video Recording—Some Experiments and Future Considerations", SMPTE Journal, Sep. 1980, vol. 89, pp. 658–662.

Shimada et al, "DC—Free 8–9 Block Code—A Channel Code for Digital VTR", pp. 9–16, Mar. 1983.

Primary Examiner—Donald Hajec
Assistant Examiner—Thien Minh Le
Attorney, Agent, or Firm—Fay, Sharpe, Beall, Fagan, Minnich & McKee

[57] ABSTRACT

A signal processing method for recording and playing back recorded data with decreased detection errors originating from residual marks characteristic of an overwrite medium is performed by 8/9 modulating input data, and by inverting the polarity of the modulated data string at each "1" bit to produce a DC-free recording pulse. The thus-recorded signal is played back through a playback equalizer 8 before being converted by an A/D converter 9 into digitized amplitude data. The digitized data are processed to determine an identification level, which identification level is stored as well as used to determine displacement quantities for quantized bits derived from the analog playback signal. The number of "1" bits is counted by a counter 20, and an error in the number of "1" bits is detected by a comparator 21. An error bit decision circuit 22 determines which bit is most likely to be erroneous on the basis of displacement quantity, and the likely erroneous bit is corrected prior to outputting the data for 8/9 demodulation.

16 Claims, 4 Drawing Sheets

FIG. 2(a)
| ONE BLOCK | | | | | | | | | |
|---|---|---|---|---|---|---|---|---|---|
| INPUT DATA | 0 | 1 | 1 | 0 | 1 | 1 | 0 | 0 | |
| AFTER 8/9 MODULATION | 0 | 1 | 1 | 1 | 0 | 1 | 0 | 1 | 0 |
FIG. 2(b)
DC-FREE DATA
FIG. 3(a)
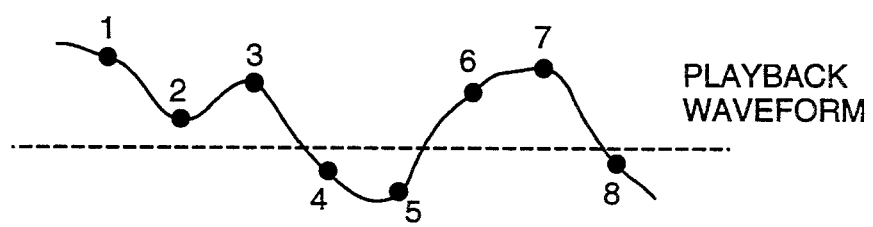
PLAYBACK WAVEFORM
FIG. 3(b)
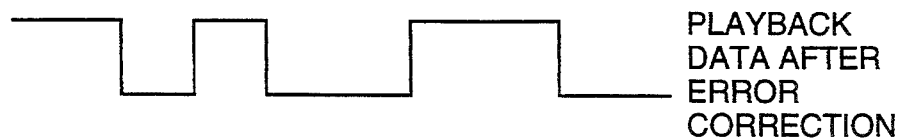
PLAYBACK DATA AFTER ERROR CORRECTION

FIG. 5

| NUMBER OF ERROR BITS | ERROR | CORRECT | \|A-B\| | POLARITY |
|---|---|---|---|---|
| 1 | 0 | 1 | 2 | + |
|   | 1 | 0 |   | - |
| 2 | 00 | 11 | 4 | + |
|   | 11 | 00 |   | - |
|   | 01 | 10 | 0 | N/A |
|   | 10 | 01 |   |   |

DATA RECORDING/PLAYBACK APPARATUS AND SIGNAL PROCESSING METHOD

BACKGROUND OF THE INVENTION

1. Field of the Invention

The present invention relates generally to a data recording/playback apparatus and method for use in a system for recording and playing back digital signals with high density, and, more particularly, to a data recording/playback apparatus and method for an overwrite medium which is susceptible to errors resulting from residual marks, for example in an optical recording medium.

2. Description of the Related Art

In a conventional digital data recording/playback apparatus, a fixed data identification level is set as a threshold for establishing bit levels of 1 or 0 for an analog playback signal. For example, Japanese Patent Laid-Open No. 2-81324 discloses a method in which the center of the envelope of a playback signal is sliced.

For an optical recording medium capable of being overwritten, and a magnetic recording medium useful for optomagnetic recording and phase change recording, unevenness in recording sensitivity may develop due to the nature of the processing medium, which causes the level of the playback signal to fluctuate. For example, the typical data detection method suffers from low-frequency AC modulation distortion due to reflectivity variations between individual tracks on an optical disk. Consequently, a fixed data identification level has proven difficult to establish. The conventional practice has thus been to eliminate the variation of the signal level or to devise circuitry in which the identification level itself follows the fluctuation of the playback signal level.

Further, as optical bits on the order of microns in size are used for recording and playing back data on optomagnetic and phase change recording media, high-density recording has become possible, as compared with magnetic recording. However, the residual mark per bit unit tends to increase for the thermal recording that is commonly employed for optical systems. Thus, detection errors originating from the level fluctuation per bit unit due to residual marks are likely to occur even though the data identification level is properly set by the digitizing circuitry.

SUMMARY OF THE INVENTION

The present invention provides a signal processing method for recording and playing back data with high reliability while reducing detection errors originating from residual marks. The invention accomplishes this objective by dividing information data into, for instance, 8-bit blocks, modulating the data into DC-free recording data in each block for recording, digitizing the subsequent playback signal, and performing a particular data identification process.

The input information data are modulated to become DC-free recording data, and the data thus modulated are recorded so that the playback signal is DC-free. When the playback signal is then digitized by an A/D converter, an optimum identification level can be determined simply by arithmetically averaging the amplitude value at each identification point in the block. Since the DC-free property in the block is guaranteed, any difference between the number of 0 bits and 1 bits of the identification data or in the expected number of 0 or 1 bits, indicates that an error originating from a residual mark has occurred. Such errors can be detected by observing the difference, and corrected by recognizing and acting on the high probability that the erroneous bit or bits have an analog value that is close to the analog value of the identification level. In other words, an erroneous bit is most likely to be a bit whose analog value falls near the threshold for differentiating between 0- and 1-bit values.

BRIEF DESCRIPTION OF THE DRAWINGS

FIG. 2(a) illustrates an 8/9 modulation method;

FIG. 2(b) shows a DC-free recording waveform corresponding to the modulation of FIG. 2(a);

FIG. 3(a) illustrates an analog playback signal derived by the circuit of FIG. 1;

FIG. 3(b) illustrates the digitized playback waveform;

FIG. 5 is a table showing the error correction scheme for the second embodiment.

DETAILED DESCRIPTION OF THE PREFERRED EMBODIMENTS

The specific embodiments described below pertain to optical disk apparatus and methods. However, one of ordinary skill in the art will readily recognize that the basic teachings of the invention also apply to other digital data recording/playback apparatus such as video tape recorders, for example.

Figure 1:
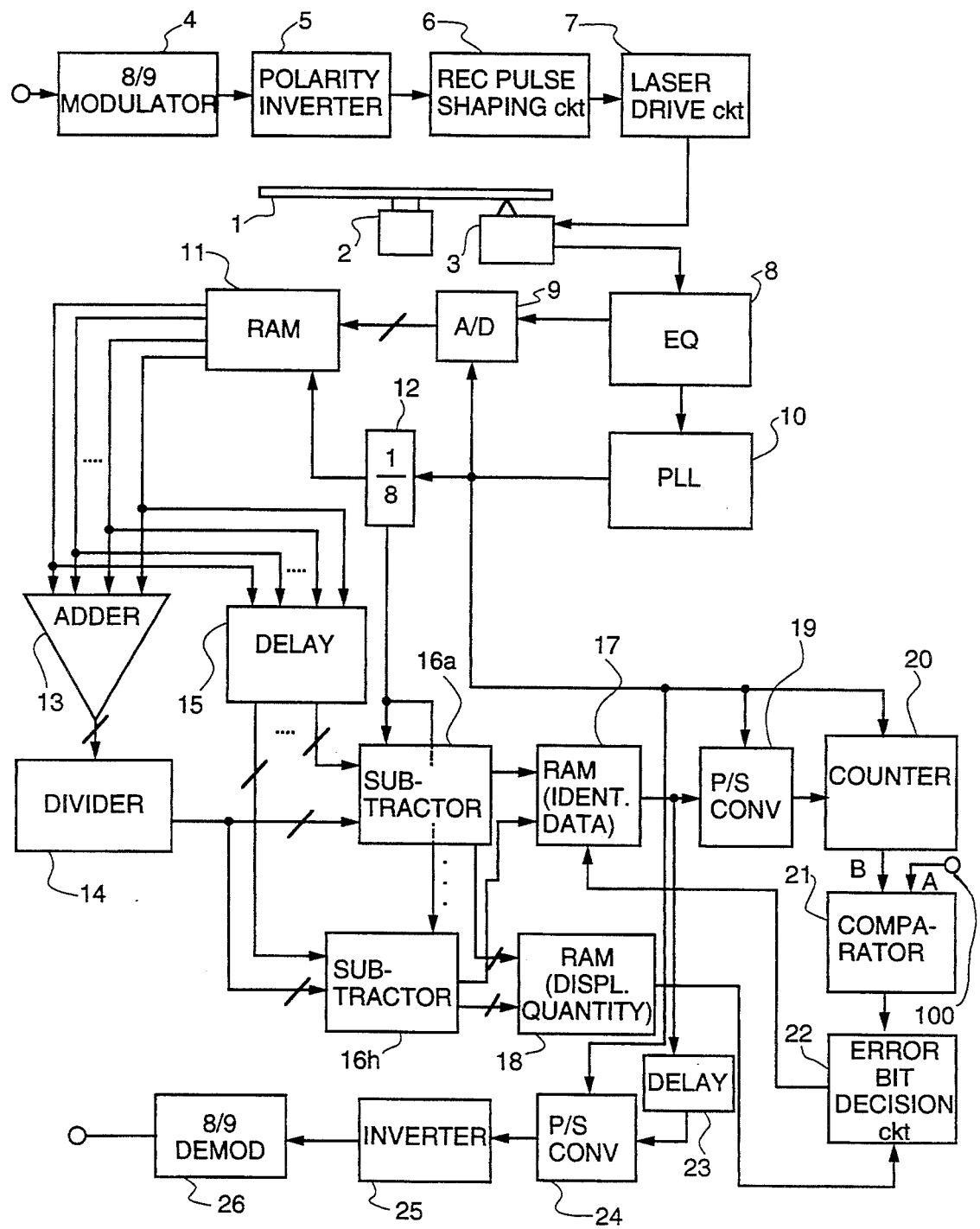
FIG. 1 illustrates a block diagram of a first embodiment of the present invention.

FIG. 1 illustrates a block diagram of a first embodiment of the invention. An optical disk 1 is rotatably fitted to a spindle 2, and a motor drive mechanism (not shown) controls the rotation of disk 1. By way of example, optical disk 1 may be an optomagnetic recording medium, a phase change medium, or a write once-type medium, although the particular type of medium is not restricted to these examples. As further shown in FIG. 1, an optical head 3 is arranged in an operative position opposite to the recording surface of optical disk 1, and is controlled by an access mechanism (not shown).

Information data to be recorded on optical disk 1 is first modulated by an 8/9 modulator 4 into 9-bit data with 8 bits as one block. The polarity of the recording optical pulse waveform to be applied to optical head 3 is inverted by an inverter 5 at each 1 bit of the modulated data string so that a DC-free recording pulse is obtained.

FIG. 2 particularly illustrates this process. As shown in FIG. 2(a), an input data block 01101100 is converted to the 9-bit block 011101010 by 8/9 modulator 4. The waveform shown in FIG. 2(b) is a DC-free recording optical pulse output by the laser which writes on optical disk 1 (for example). Note that a polarity transition occurs in the DC-free waveform at each 1 bit of the modulated data string.

The recording pulse is shaped by a recording pulse shaping circuit 6, and supplied via a laser drive circuit 7 to the optical head 3. A semiconductor laser (not shown) is preferably mounted on the optical head, and recording light beams emitted from the laser are focused onto optical disk 1 by an objective lens (not shown), as is conventional. The recording pulse thus modulated provides a focused spot whose luminous intensity is also modulated. Thus, data are recorded on the optical disk.

When a data bit thus recorded is thereafter read, a focused spot of weak intensity is used to detect the presence or absence of the data bit from a change in the reflected light quantity. If present, the data bit is converted into an electrical signal as playback data.

After gain reduction in a high-frequency zone is preferably corrected by a playback equalizer 8, the playback signal is supplied to an A/D converter 9 and a PLL circuit 10, A channel clock signal is extracted from the playback signal in the PLL circuit 10 to provide a timing signal for A/D conversion in converter 9. In this regard, any conventional method for obtaining the channel clock signal from the playback signal can be employed, such as, for example, setting prebits at predetermined intervals on the disk prior to recording, from which the channel clock signal can be obtained and used during playback.

FIG. 3 illustrates the analog playback waveform. Dots 1–8 represent the sampled quantities used for A/D conversion in A/D converter 9. As a result of subjecting the playback waveform to A/D conversion on a block-by-block basis (with 8 bits as a unit), amplitude levels ranging from 1 to 8 are obtained. An optimum identification level is obtained by arithmetically averaging these levels to determine 0 and 1 bits. Since the sum total of 1 bits (or 0 bits) in the block has been fixed to 4 according to the rule of 8/9 modulation, an error can be detected whenever the sum total differs from 4.

When an error is detected, the method concludes that the error is most likely to occur for a sampled analog value that is near the threshold, or identification, level. Thus, for the example shown in FIG. 3(a), the invention determines that bit 2, for example, is most likely to have been erroneously assigned a 1 value. Thus, its polarity is inverted, and the resulting waveform shown in FIG. 3(b) is obtained.

With additional reference to FIG. 1, a specific example of the method is carried out as follows. The playback signal output from playback equalizer 8 is supplied to A/D converter 9. The digitized data signal has, for example, 6-bit precision, and is stored in RAM 11 on the basis of 8 bits as a block unit of information data.

Playback equalizer 8 further outputs a signal to PLL 10, whose output is divided by 8 in divider 12 to produce a timing signal at which data are written into RAM 11. This clock pulse is further used to read data from RAM 11 into adder 13, where the parallel data are digitally added. The result of the addition is divided by 8 in digital divider 14, the output representing the identification level.

The data stored in RAM 11 are also output to delay circuit 15 in parallel with the operation of adder 13. Delay circuit 15 then outputs the parallel bits of the stored data into eight digital subtractors 16a–16h. In accordance with the identification level obtained from digital divider 14 and stored in digital subtractors 16a–16h, the difference between the digital identification level and the eight digital amplitude levels are respectively computed to determine the 0 or 1 data identification as well as the displacement quantity (i.e., difference between the digital value and the identification level). The identification data and displacement quantities are respectively stored in RAM 17 and RAM 18.

The identification data stored in RAM 17 are converted to serial data by parallel/serial converter 19, whose output is provided to counter 20 to determine the number of 1 bits. A comparator 21 compares the output B of counter 20 with a threshold level A (binary 100 (decimal 4) for 8/9 modulation).

When A≠B, an error flag is provided to an error bit decision circuit 22. The error bit decision circuit 22 decides that the error has arisen at a bit whose displacement quantity is small on the basis of the displacement quantity data stored in RAM 18 when the error flag is set. The identification data in RAM 17 are delayed by the delay circuit 23 so that error correction may be accomplished in accordance with an instruction from error bit decision circuit 22.

Thereafter, the identification data are converted by parallel/serial converter 24 to serial data after the polarity of the bit that has been determined to be in error has been inverted. The data thus converted are inverted in invertor circuit 25 (a corresponding operation to "undo" the inversion of invertor 5) and demodulated in 8/9 demodulator 26 to recover the original information data.

Figure 4:
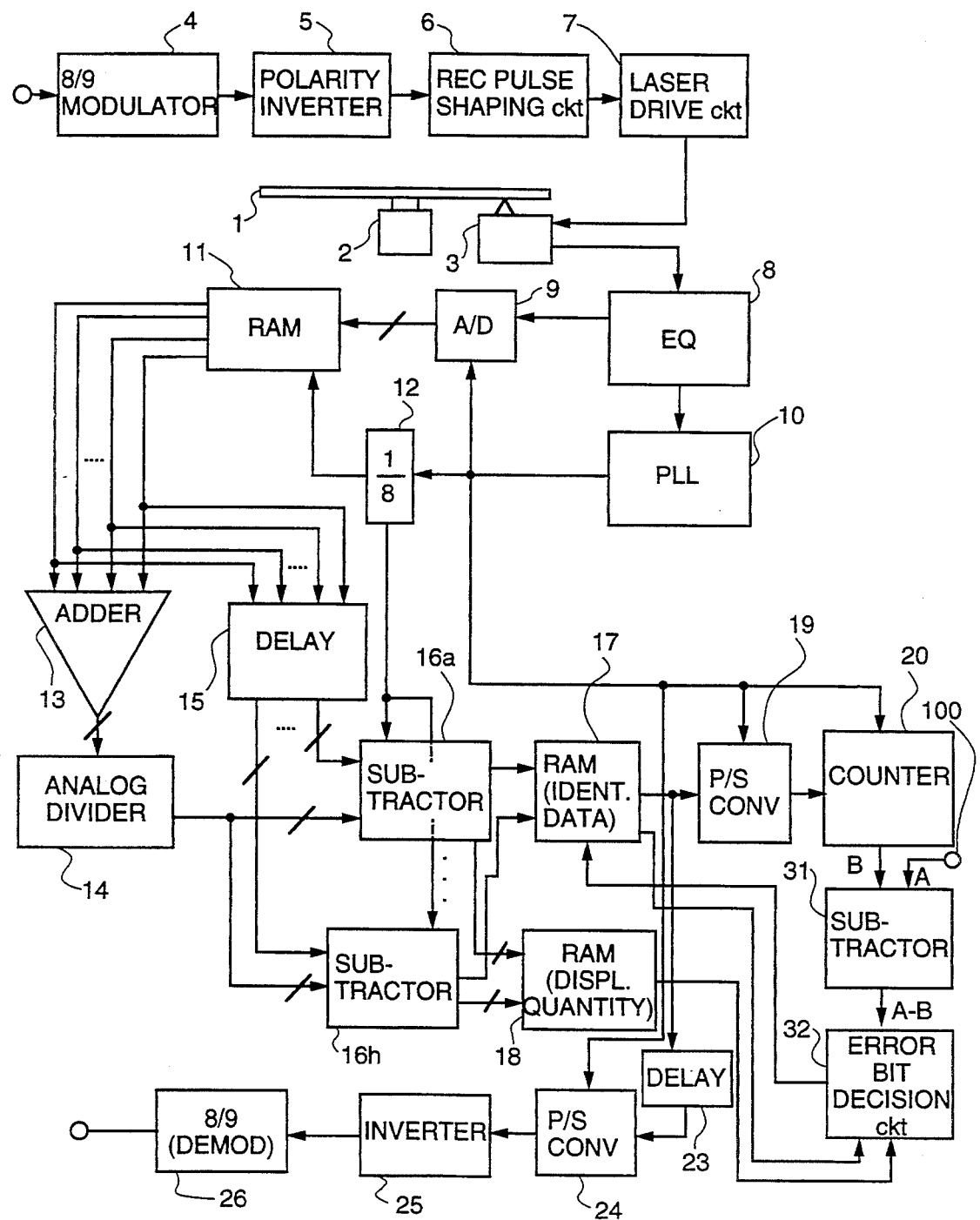
FIG. 4 illustrates a block diagram of a second embodiment of the present invention.

In a second embodiment of the invention, FIG. 4 illustrates a block diagram of a circuit capable of discriminating errors occurring in more than one bit. In the first embodiment, for 8/9 modulation, when the number of 1 bits and 0 bits are both 4, it is assumed that the data are correctly demodulated because A−B=0. However, it is possible that two errors of opposite polarity have occurred, in which case the data have been erroneously demodulated even though A−B=0. Further, two errors of the same polarity may have occurred, in which case a single bit correction would be insufficient. Thus, according to this embodiment, both odd and even numbers of error bits can be detected as follows.

First, assuming that a 1-bit detection error has occurred, there exist two possible cases for errors, as shown in FIG. 5; (i) a 0 bit is mistaken for a 1 bit, and (ii) a 1 bit is mistaken for a 0 bit. The value of A−B will be +2 for (i) and −2 for (ii). The sign for the calculation A−B corresponds to the bit type that must be corrected; i.e., it indicates "1" if positive and "0" if negative. Furthermore, the absolute value of A−B corresponds to the number of bits that need to be corrected. Therefore, when A−B is +2, a single 1 bit should be corrected to 0, and when A−B is −2, a single 0 bit should be corrected to 1. This operation is performed at error bit decision circuit 32.

Error bit decision circuit 32 reads the displacement data for RAM 18 according to the digital value of A−B provided from subtractor 31, and prioritizes the bits so that the bit with the smallest displacement (corresponding to the greatest likelihood for error) is placed first. Thus, as the bit polarity that must be corrected can be identified in accordance with the polarity of A−B, corrections can be made with great accuracy.

Next, assuming that a 2-bit detection error has occurred within a single byte, there are four possible cases for errors as illustrated in FIG. 5: (i) "—0—0—" is mistaken for "—1—1—", (ii) "—1—1—" is mistaken for "—0—0—", (iii) "—0—1—" is mistaken for "—1—0—", and (iv) "—1—0—" is mistaken for "—0—1—". The value of A−B is +4 for (i), −4 for (ii), and 0 for (iii) or (iv). As for the 1-bit error case, the sign of A−B corresponds to the type of bit that needs to be corrected, while the absolute value of A−B corresponds to the number of bits that need to be corrected. Consequently, an absolute value of 4 indicates that there are errors in two detected 1 bits and in two detected 0 bits.

Subsequently, displacement data read from RAM 18 are prioritized bit-by-bit in accordance with the displacement values of the individual bits. In this case, however, two bits will have their polarities corrected in accordance with the polarity of A−B. Specifically, two 1 bits will be corrected if the polarity of A−B is positive, two 0 bits will be corrected if the polarity of A−B is negative.

On the other hand, for a case such as (iii) or (iv) above, the occurrence of errors cannot be detected by this method, or may not require correction, or may be corrected by assuming that the probability of error occurrence is high if a detected bit has a displacement value less than a certain level.

Errors of one and two bits have been explained above; an explanation for errors of three or more bits is similar. Thus, a similar method for correction can be used, which method is not explicitly described here.

For the actual error correction, after the identification data in RAM 17 are corrected by delaying the data through delay circuit 23 for the same amount of time required for error detection at error bit decision circuit 32, the identification data are converted into serial data at parallel/serial converter 24, inverted in invertor 25, and demodulated in 8/9 demodulator 26, as before.

Although the invention has been described with respect to 8/9 modulation and demodulation, any modulation method can be applied without sacrificing the substance of the invention so long as a DC-free block code is employed. For example, 8/10 modulation/demodulation has proven particularly effective because all usable patterns are DC-free, as opposed to 8/9 modulation/demodulation, in which at least two patterns are not DC-free.

In accordance with the present invention, it is possible to provide a data recording/playback apparatus with large scale integration, and error correction can be performed at the time of data identification to thus lighten the burden on the error correction circuit.

Various modifications of the invention will become apparent to those of ordinary skill in the art. All such modifications that basically rely upon the teachings through which the invention has advanced the state of the art are properly considered within the spirit and scope of the invention.

We claim:

1. A signal processing method, comprising the steps of:
    inputting information data;
    blockwise modulating the input data to produce recording data substantially free from undesirable DC signals;
    recording the recording data on a recording medium;
    reading the recording data from the recording medium as playback data;
    digitizing the playback data to produce blocks of digitized playback data; and
    performing a data identification process to identify and correct errors in the playback data;
    wherein the data identification process includes the steps of:
        establishing an identification level above which playback data bits are designated as 1 bits, and below which playback data bits are designated as 0 bits;
        adding the number of bits designated as 1 bits;
        comparing the sum of 1 bits to a predetermined value;
        determining that the playback data contain an error bit when the results of the comparing step indicate a difference between the sum of 1 bits and the predetermined value; and
    correcting an error detected during the determining step.

2. A signal processing method, comprising the steps of:
    inputting information data;
    blockwise modulating the input data to produce recording data substantially free from undesirable DC signals;
    recording the recording data on a recording medium;
    reading the recording data from the recording medium as playback data;
    digitizing the playback data to produce blocks of digitized playback data; and
    performing a data identification process to identify and correct errors in the playback data;
    wherein the data identification process includes the step of:
        establishing an identification level above which playback data bits are designated as 1 bits, and below which playback data bits are designated as 0 bits; and
    wherein the identification level is separately established for each block comprising the digitized playback data.

3. A signal processing method as claimed in claim 2, wherein the data identification process further includes the steps of:
    adding the number of bits designated as 1 bits;
    comparing the sum of 1 bits to a predetermined value;
    determining that the playback data contain an error bit when the results of the comparing step indicate a difference between the sum of 1 bits and the predetermined value; and
    correcting an error detected during the determining step.

4. A signal processing method as claimed in claim 3, wherein the data identification process further comprises the step of determining a displacement quantity for each playback data bit, the displacement quantity being defined as the absolute value of the difference between a data bit value and the identification level; and
    wherein the correcting step is performed by inverting the polarity of a bit having the smallest displacement quantity.

5. A signal processing method as claimed in claim 2, wherein the identification level is established blockwise by arithmetically averaging the respective bit amplitude levels for each block of the digitized playback data.

6. A signal processing method as claimed in claim 2, wherein the modulating step is performed so that the recording data comprise a waveform having a polarity inversion at each 1 bit of the modulated data.

7. A signal processing method as claimed in claim 6, wherein the modulating step is performed according to 8/9 modulation.

8. A signal processing method as claimed in claim 6, wherein the modulating step is performed according to 8/10 modulation.

9. A signal processing method as claimed in claim 2, wherein the modulating step is performed according to 8/10 modulation.

10. A signal processing method as claimed in claim 2, further comprising the step of extracting a channel clock signal from the playback data to control the digitizing step.

11. A signal processing method as claimed in claim 2, wherein the modulating step is performed according to 8/9 modulation.

12. A signal processing apparatus, comprising:

means for blockwise modulating an input information data signal to produce a modulated output signal;

means for generating a recording pulse signal by inverting the polarity of the recording pulse signal at each 1 bit of the modulated signal;

means for recording a signal on a recording medium in accordance with the recording pulse signal;

means for reading the recording signal from the recording medium as a playback signal;

means for digitizing the playback signal to produce blocks of digitized playback signal data;

means for establishing an identification level above which playback signal data bits are designated as 1 bits and below which the playback signal data bits are designated as 0 bits;

means for detecting an error bit in the playback signal; and means for correcting the detected error bit;

wherein the identification level is separately established for each block of the digitized playback signal data.

13. A signal processing method as claimed in claim 12, wherein the means for detecting an error bit includes means for adding the number of 1 bits of the digitized playback signal and comparing the sum to a predetermined value, and means for determining that an error bit is present when the comparison shows a difference between the sum and the predetermined value.

14. A signal processing apparatus as claimed in claim 13, wherein the means for correcting the error bit includes means for selecting a bit that has the smallest displacement quantity of the playback signal, the displacement quantity being defined as the difference between the amplitude of each playback signal data bit and the identification level, and means for inverting the polarity of the bit having the smallest displacement quantity.

15. A signal processing apparatus as claimed in claim 12, wherein the modulating means is an 8/9 modulator.

16. A signal processing apparatus as claimed in claim 12, wherein the modulating means is an 8/10 modulator.

* * * * *